(12) United States Patent
Furutani et al.

(10) Patent No.: US 9,510,447 B2
(45) Date of Patent: Nov. 29, 2016

(54) PRINTED WIRING BOARD AND METHOD FOR MANUFACTURING THE SAME

(71) Applicant: IBIDEN CO., LTD., Ogaki-shi (JP)

(72) Inventors: Toshiki Furutani, Ogaki (JP); Yasushi Inagaki, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/799,860

(22) Filed: Jul. 15, 2015

(65) Prior Publication Data
US 2016/0021758 A1   Jan. 21, 2016

(30) Foreign Application Priority Data

Jul. 15, 2014 (JP) .................................. 2014-145435

(51) Int. Cl.
*H05K 1/09* (2006.01)
*H05K 1/11* (2006.01)
*H05K 3/10* (2006.01)
*H05K 3/40* (2006.01)
*H05K 3/00* (2006.01)

(52) U.S. Cl.
CPC ................. *H05K 1/09* (2013.01); *H05K 1/115* (2013.01); *H05K 3/0017* (2013.01); *H05K 3/103* (2013.01); *H05K 3/4038* (2013.01); *H05K 2203/0384* (2013.01)

(58) Field of Classification Search
CPC ........ H05K 1/09; H05K 1/116; H05K 1/115; H05K 3/0032
See application file for complete search history.

(56) References Cited

U.S. PATENT DOCUMENTS

2015/0257262 A1* 9/2015 Lee et al. ............. H05K 1/0346

FOREIGN PATENT DOCUMENTS

JP   10-173316 A   6/1998

OTHER PUBLICATIONS

U.S. Appl. No. 14/799,887, filed Jul. 15, 2015, Furutani, et al.

* cited by examiner

*Primary Examiner* — Jeremy C Norris
(74) *Attorney, Agent, or Firm* — Oblon, McClelland, Maier & Neustadt, L.L.P.

(57) ABSTRACT

A printed wiring board includes an insulation layer, a first conductive layer embedded into first surface of the insulation layer, a second conductive layer formed on second surface of the insulation layer, a via conductor penetrating through the insulation layer and electrically connecting the first and second layers, and a solder-resist layer covering the first layer and having an opening structure forming an exposed structure of the first layer. The exposed structure is formed to connect an electronic component to the first layer, and the first layer has a barrier-metal layer and a metal layer on the first layer such that the barrier-metal layer is on surface of the first layer and includes metal different from metal forming the metal layer and that the metal layer is on surface of the barrier-metal layer in the exposed structure and protruding from the first surface of the insulation layer.

20 Claims, 7 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-145435, filed Jul. 15, 2014, the entire contents of which are incorporated herein by reference.

BACKGROUND OF THE INVENTION

Field of the Invention

The present invention relates to a printed wiring board for mounting an electronic component and its manufacturing method. More specifically, the present invention relates to a printed wiring board with a structure capable of achieving secure connection and enhancing connection reliability between an electronic component and the wiring board, and to a method for manufacturing such a printed wiring board.

Description of Background Art

JP H10-173316A describes a method for manufacturing a wiring board by pressing resin film with conductive-circuit patterns onto an insulative substrate and then by stripping the resin film from the insulative substrate so that the conductive-circuit patterns are embedded in the insulative substrate surface. The entire contents of this publication are incorporated herein by reference.

SUMMARY OF THE INVENTION

According to one aspect of the rpesent invention, a printed wiring board includes a resin insulation layer, a first conductive layer formed on a first-surface side of the resin insulation layer such that the first conductive layer is embedded into a first surface of the resin insulation layer, a second conductive layer formed on a second-surface side of the resin insulation layer such that the second conductive layer is formed on a second surface of the resin insulation layer, a via conductor formed in the resin insulation layer such that the via conductor is penetrating through the resin insulation layer and electrically connecting the first conductive layer and the second conductive layer, and a solder-resist layer formed on the first surface of the resin insulation layer such that the solder-resist layer is covering the first conductive layer and having an opening structure forming an exposed structure of the first conductive layer. The exposed structure of the first conductive layer is formed to connect an electronic component to the first conductive layer, and the first conductive layer has a barrier-metal layer and a metal layer formed on the first conductive layer such that the barrier-metal layer is formed on a surface of the first conductive layer and includes a metal different from a metal forming the metal layer and that the metal layer is formed on a surface of the barrier-metal layer in the exposed structure of the first conductive layer and protruding from the first surface of the resin insulation layer.

According to another aspect of the rpesent invention, a method for manufacturing a printed wiring board includes forming a barrier-metal layer on a metal film formed on a carrier, forming a first conductive layer on the barrier-metal layer, forming a resin insulation layer on the metal film such that the first conductive layer is embedded into the resin insulation layer, forming a hole for a via conductor from an exposed-surface side of the resin insulation layer such that the hole penetrates through the resin insulation layer and exposes a portion of the first conductive layer, forming a second conductive layer on the exposed-surface side of the resin insulation layer such that the hole is filled with a conductive material, removing the carrier from the metal film such that a surface of the metal film is exposed, applying selective etching to the metal film by using the barrier-metal layer as an etching stopper such that a metal layer having a pattern formed to connect an electronic component is formed by removing a portion of the metal film, and forming a solder-resist layer on the first surface of the resin insulation layer such that the solder-resist layer covers the first conductive layer and has an opening structure forming an exposed structure of the first conductive layer including the metal layer having the pattern formed to connect the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
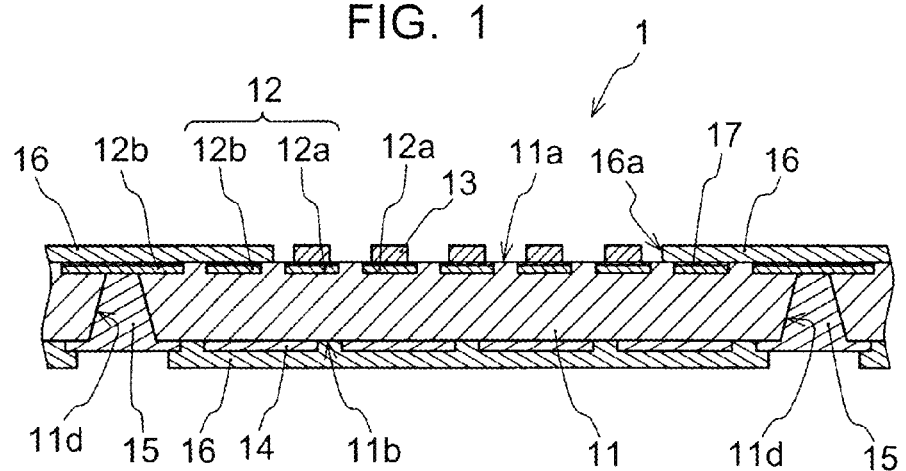
FIG. 1 is a cross-sectional view showing a printed wiring board according to an embodiment of the present invention.

The embodiments will now be described with reference to the accompanying drawings, wherein like reference numerals designate corresponding or identical elements throughout the various drawings.

A printed wiring board according to an embodiment of the present invention is described with reference to the accompanying drawings. FIG. 1 is a cross-sectional view showing printed wiring board 1 of the present embodiment. Printed wiring board 1 is provided with resin insulation layer 11 having first surface (11a) and its opposing second surface (11b) along with first conductive layer 12 embedded on the first-surface (11a) side to be electrically connected to an electronic component (not shown). Second conductive layer 14 is formed on second surface (11b) of resin insulation layer 11. In addition, via conductor 15 is formed, penetrating through resin insulation layer 11 and electrically connecting first conductive layer 12 and second conductive layer 14. Solder-resist layer 16 is formed on first surface (11a) of resin insulation layer 11 and on first conductive layer 12. Opening (16a) is formed in solder-resist layer 16 to expose first patterns (12a) of first conductive layer 12 which are for connection with an electronic component. Barrier-metal layer 17 and metal layer 13 are formed in that order on first patterns (12a) of first conductive layer 12 exposed in opening (16a). Barrier-metal layer 17 is made of a metal different from that of metal layer 13, and metal layer 13 protrudes from the first surface (11a) of resin insulation layer 11.

Resin insulation layer 11 has first surface (11a) and second surface (11b) opposite first surface (11a). Resin insulation layer 11 may be formed, for example, by impregnating a core material such as glass fiber with a resin composition that contains filler, or may be formed using only a resin composition that contains filler. Resin insulation layer 11 may be single-layered or multilayered. When resin insulation layer 11 is formed with multiple insulation layers, it is easier to adjust, for example, its thermal expansion coefficient, flexibility and thickness. An example of the resin is epoxy resin or the like. The thickness of resin insulation layer 11 is 25~100 μm, for example. First conductive layer 12 is exposed on first surface (11a). On first surface (11a) of resin insulation layer 11, solder-resist layer 16 is formed in a way that a region of first patterns (12a) for mounting an electronic component is exposed in opening (16a) but second patterns (12b) and their surrounding portions of resin insulation layer 11 are covered. Later-described second conductive layer 14 is formed on second surface (11b) of resin insulation layer 11.

First conductive layer 12 is a conductive pattern embedded in first surface (11a) of resin insulation layer 11. In the example shown in FIG. 1, barrier-metal layer 17 made of a metal different from that of metal layer 13 is formed on a surface of first conductive layer 12, which is embedded in resin insulation layer 11 in a way to expose a surface of barrier-metal layer 17. Embedding barrier-metal layer 17 and first conductive layer 12 in resin insulation layer 11 contributes to forming a thinner printed wiring board 1 while enhancing adhesiveness between the first conductive layer and resin insulation layer 11. On the other hand, when solder-resist layers 16 are formed respectively on first surface (11a) and second surface (11b) to have a different thickness, resin insulation layer 11 tends to warp as described later. First conductive layer 12 includes portions for connection with the electrodes of an electronic component (not shown) through soldering and the rest for other purposes. In FIG. 1, portions to be connected to electrodes of an electronic component are shown as first patterns (12a), and the rest of first conductive layer 12 are shown as second patterns (12b). Examples of an electronic component are semiconductor elements such as IC chips and discrete semiconductors. The method for forming first conductive layer 12 is not limited specifically. First conductive layer 12 may be made of electroplated film formed by electroplating. Electroplated film is preferred for first conductive layer 12, since pure metal film is formed. Copper, for example, is used for forming first conductive layer 12. Copper is easy to electroplate, has low electrical resistance and seldom corrodes. The thickness of first conductive layer 12 is 3~20 μm, for example.

Of the patterns formed in first conductive layer 12, barrier-metal layer 17 and metal layer 13 are formed on first patterns (12a) for mounting an electronic component and exposed in opening (16a) of solder-resist layer 16. Barrier-metal layer 17 is made of a metal different from that of metal layer 13, for example, nickel or titanium. Barrier-metal layer 17 works as a barrier to prevent the etching of first conductive layer 12, which is usually made of the same material as that of metal layer 13 when metal layer 13 is formed by patterning metal film (13a). As described later, it is difficult to perform strict control on an etching process especially when metal layer 13 is made thicker, but barrier-metal layer 17 prevents over-etching of first conductive layer 12, allowing metal layer 13 to be formed accurately.

For metal layer 13 and each pattern of first conductive layer 12 where metal layer 13 is formed (as is clear from the later-described manufacturing method, barrier-metal layer 17 is patterned the same as first conductive layer 12), size and positional relationships are described later. The metal for forming metal layer 13 is not limited specifically, as long as it is capable of connecting first patterns (12a) of first conductive layer 12 and an electronic component (not shown) while mostly preventing electrical loss. Copper or nickel foil is preferred for metal layer 13. However, to form a thicker metal layer 13, copper is preferred due to its low electrical resistance, and copper is also preferred to be used for forming first conductive layer 12 for the same reason. Accordingly, nickel or the like is preferred for barrier-metal layer 17 to be formed between those layers. Forming metal layer 13 and barrier-metal layer 17 using copper or nickel is preferred, since those metals are inexpensive, easier for forming a layer, and low in electrical resistance.

Metal layer 13 may be single-layered or may be formed with multiple layers, such as Cu/Ni, Cu/Ti, Au/Pd/Ni or Au/Ni, for example. Ni or Ti provided as the outermost layer works as a surface protective film. However, when metal layer 13 is multilayered using those layers, a metal for forming barrier-metal layer 17 is preferred to be different from any of the metals used in metal layer 13; at least, a metal different from that of the lowermost layer is selected among the multiple layers (the layer adjacent to barrier-metal layer 17).

To enhance connection reliability with an electronic component in consideration of the warping of a resin insulation layer caused by a rise and fall in temperature during the procedure for mounting an electronic component or caused by heat cycles after the wiring board is installed in an electronic device and used therein, metal layer 13 is not limited to a specific thickness as long as connection with an electronic component is made easier and stress exerted on the bonded portions with the electronic component is mitigated, even when the wiring board warps slightly. If first patterns (12a) for connection with an electronic component are formed only with first conductive layer 12, first patterns (12*a*) except for the surface of first conductive layer 12 are covered by resin insulation layer 11. Therefore, when printed wiring board 1 warps due to unbalanced solder-resist layers on first surface (11*a*) and second surface (11*b*) of resin insulation layer 11, stress caused by different thermal expansion coefficients is exerted only on the soldered connection portions with the electronic component. Eventually, the soldered connection portions succumb to such stress and tend to be damaged. However, when metal layer 13 is provided, since metal layer 13 is surrounded by space, stress is likely to be absorbed when metal layer 13 expands/contracts. The thickness of metal layer 13 is approximately the same as or greater than the thickness of solder-resist layer 16; for example, it may be set at 5~20 µm. The thickness of metal layer 13 is preferred to be greater than that of solder-resist layer 16, since stress is more likely to be mitigated. Second patterns (12*b*) of first conductive layer 12 are portions different from first patterns (12*a*) for mounting an electronic component, and are covered by solder-resist layer 16.

The degree of absorption of stress is affected not only by the thickness, but also by the shape of metal layer 13. For example, as FIGS. 4(*a*) and 4(*b*) show enlarged views by emphasizing metal layer 13 in a thickness direction, stress is likely to be absorbed when the side surface of metal layer 13 is curved.

Figure 4A:
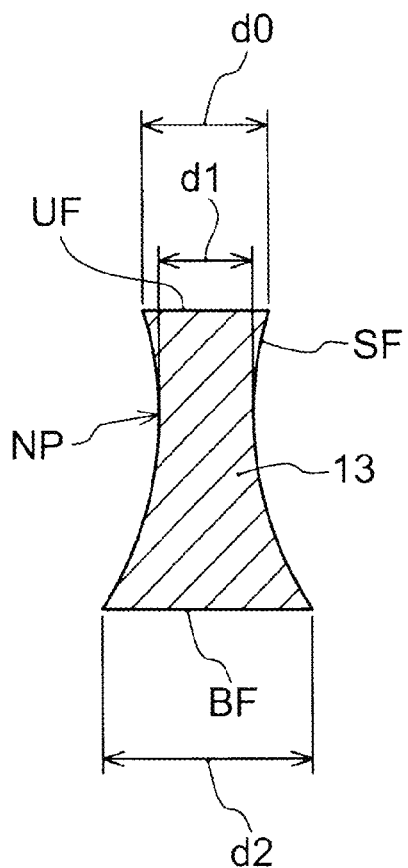
FIGS. 4A and 4B are enlarged cross-sectional views emphasized in a thickness direction to illustrate the shape of a metal layer.
Figure 4B:
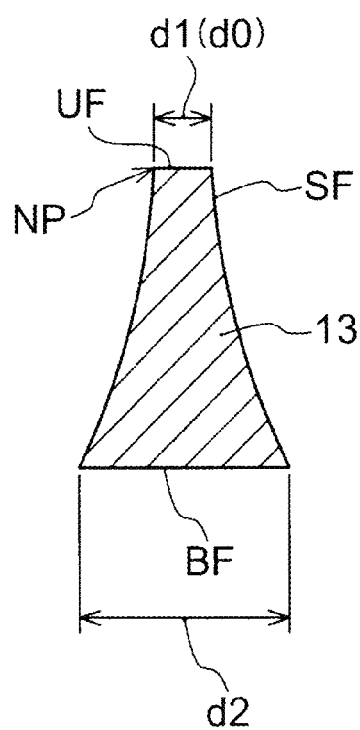

Namely, the structure of metal layer 13 shown in FIG. 4(*a*) has upper surface (UF), lower surface (BF) opposite the upper surface, and side surface (SF) between the upper and lower surfaces. Side surface (SF) is curved. Width (d1) at upper surface (UF) of metal layer 13 is preferred to be smaller than width (d2) at lower surface (BF). In FIG. 4(*a*), narrowest portion (NP) is present between upper surface (UF) and lower surface (BF), and width (d0) of the narrowest portion (NP) is smaller than width (d1) at upper surface (UF) and narrower than width (d2) at lower surface (BF).

In the example shown in FIG. 4(*b*), the width of metal layer 13 increases from upper surface (UF) toward lower surface (BF). In FIG. 4(*b*), (d1) is equal to (d0) since narrowest portion (NP) is formed at upper surface (UF) of metal layer 13. The shape of side surface (SF) of metal layer 13 is not straight, but curved. Thus, metal layer 13 mitigates stress caused by differences in physical properties between the wiring board and an electronic component or the like mounted thereon. Examples of physical properties are thermal expansion coefficient and Young's modulus. The shape shown in FIG. 4(*a*) is more preferred for mitigating stress than the shape in FIG. 4(*b*). Those shapes may be adjusted by etching conditions or the like. By controlling the thickness or shape of metal layer 13, stress is further mitigated.

Second conductive layer 14 is formed on second surface (11*b*) of resin insulation layer 11. The method for forming second conductive layer 14 is not limited specifically. Copper, for example, is used for forming second conductive layer 14. The thickness of second conductive layer 14 is 3~20 µm. In the example in FIG. 1, second conductive layer 14 is single-layered. However, it may also be formed with metal foil and plated film as described later.

Via conductor 15 penetrates through resin insulation layer 11 and electrically connects first conductive layer 12 and second conductive layer 14. Via conductor 15 is formed by filling conductor in hole (11*d*) for conductor that penetrates through second conductive layer 14 and resin insulation layer 11. Copper, for example, is used for forming via conductor 15 through electroplating, for example.

Solder-resist layer 16 is formed on first surface (11*a*) of resin insulation layer 11 and on the region of first conductive layer 12 (second conductive patterns (12*b*)) that excludes first patterns (12*a*) of first conductive layer 12 for connection with the electrodes of an electronic component. In the example shown in FIG. 1, no solder-resist layer 16 is formed on the entire region of first patterns (12*a*); solder-resist layer 16 is formed on the peripheral region, excluding the region exposed in opening (16*a*). As shown in FIG. 1, opening (16*a*) is formed as one opening that exposes wiring connection portions arranged in rows. Opening (16*a*) exposes first patterns (12*a*) of first conductive layer 12. Solder-resist layer 16 is provided to prevent solder from attaching to unwanted portions. Accordingly, instead of forming one opening (16*a*) to expose the entire region of first patterns (12*a*), it is preferred to form individual openings so that solder-resist layer (16*b*) remains between adjacent patterns (between portions of first conductive layer 12) and each connection portion in the region of first patterns (12*a*) is individually exposed as in the example later described with reference to FIG. 7. By so setting, electrical insulation between the patterns is secured. Thermosetting epoxy resin, for example, is used for forming solder-resist layer 16. The thickness of solder-resist layer 16 is set approximately at 20 µm, for example.

In printed wiring board 1 of the present embodiment, on first patterns (12*a*) of first conductive layer 12 for connection with an electronic component, metal layer 13 is formed with barrier-metal layer 17 disposed therein. First patterns (12*a*) of first conductive layer 12 are electrically connected to an electronic component (not shown) through barrier-metal layer 17 and metal layer 13.

Metal layer 13 protrudes from a surface (first surface (11*a*)) of resin insulation layer 11. Thus, unlike first conductive layer 12 embedded in resin insulation layer 11, it is relatively easy for metal layer 13 to respond to expansion/contraction. As a result, when the wiring board undergoes repeated expansion/contraction due to heat cycles after it is installed in an electronic device, stress is absorbed by metal layer 13 instead of being exerted only on soldered connection portions. Accordingly, damage derived from cracking or chipping at soldered connection portions is less likely to occur, and reliability is significantly enhanced.

Meanwhile, when resin insulation layer 11 warps due to thermal expansion/contraction, such warping may cause problems when mounting an electronic component. The procedure for mounting an electronic component is conducted, for example, by forming solder balls on terminal pads (first patterns of first conductive layer 12) of a printed wiring board or on the electrode pads of an electronic component, and by placing both the printed wiring board and the electronic component in a reflow oven heated at an approximate temperature of 200° C. Therefore, if resin insulation layer 11 warps at the time of temperature rise, an electrode pad at the center of the electronic component and an electrode pad at the periphery of the electronic component have different distances from their respective pads of first conductive layer 12, thereby causing partial connection failure. However, providing metal layer 13 reduces the distance between pads and patterns, and such a connection failure is prevented by adjusting the amount of solder or the size of metal layer 13 (the size is easily changed by modifying the mask for patterning metal layer 13): for example, a solder bump at the connection portion closer to the electronic component is lengthened sideways (i.e., made shorter) by increasing the size of a pattern of metal layer 13, whereas a solder bump at the connection portion farther from the electronic component is made taller by decreasing the size of a pattern for metal layer 13. If such an adjustment is conducted by changing the size of first patterns (12a) of first conductive layer 12, first patterns (12a) with a reduced size result in smaller contact areas with resin insulation layer 11, and their adhesive intensity is thereby lowered. However, heights of connection portions are adjusted without lowering adhesive intensity at first patterns (12a) in the present embodiment.

Due to surface tension, a solder bump tends to become round. Thus, when a pattern of metal layer 13 is small, a solder bump has a round shape between the surface of metal layer 13 and the surface of an electrode pad of the electronic component. Subsequently, a smaller metal layer 13 results in a taller solder bump, whereas a larger metal layer 13 results in a shorter solder bump. On the other hand, even if the size of metal layer 13 is constant, the size of solder bumps is adjusted by changing the size of solder balls for the same reasons described above. As a result, connection failure is prevented during a procedure for mounting an electronic component.

Figure 2:
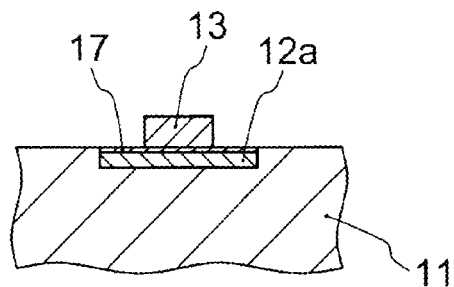
FIG. 2 is a cross-sectional view illustrating the size and positional relationship between a metal layer and a first conductive layer.

By referring to FIG. 2-4, examples of size and positional relationships are described for metal layer 13, barrier-metal layer 17 and first conductive layer 12. Metal layer 13 is obtained by patterning metal film (13a) through etching. Therefore, its size and positions are set freely by changing a mask for patterning the metal film. On the other hand, it is difficult to form the pattern of a mask that matches precisely the pattern of first conductive layer 12 due to technical limitations on the accuracy of patterning a mask, although theoretically it is possible. FIG. 2-4 are cross-sectional views to illustrate the size and positional relationships of metal layer 13, barrier-metal layer 17 and first conductive layer 12. No plan view is provided, but the planar shape of metal layer 13 may be selected freely; for example, it may be rectangular, polygonal, circular, elliptical or the like. In the present application, the width of metal layer 13 indicates the diameter if it is circular, the long side or short side if it is rectangular or polygonal, and the major axis or minor axis if it is elliptical.

In the example shown in FIG. 2, the width of metal layer 13 is smaller than any of the widths of barrier-metal 17 and first pattern (12a) of first conductive layer 12. In addition, metal layer 13 is formed not to jut out from first pattern (12a). By so setting, a solder bump provided on such a metal layer 13 is made taller as described above. Thus, such a metal layer is preferred to be formed where the distance from the electronic component is greater when warping occurs.

Figure 3A:
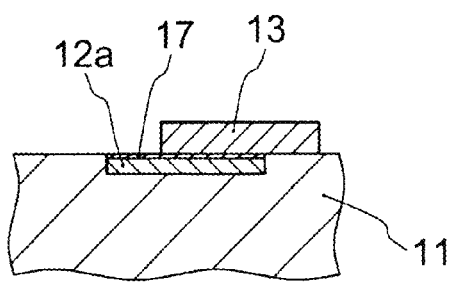
FIGS. 3A and 3B are cross-sectional views illustrating other examples of the size and positional relationship between a metal layer and a first conductive layer.

In the example shown in FIG. 3(a), the width of metal layer 13 is substantially the same as that of barrier-metal layer 17 and first pattern (12a). In addition, metal layer 13 is bonded to barrier-metal layer 17 and first pattern (12a) at a shifted position. Namely, part of the surface of metal layer 13 on the barrier-metal layer 17 side is in contact with barrier-metal layer 17, while the rest juts out from barrier-metal layer 17 and extends onto first surface (11a) of resin insulation layer 11. Such a positional shifting does not inhibit connection between metal layer 13 and barrier-metal layer 17 and first pattern (12a), and metal layer 13 is connected to the electronic component. In such a structure, resin insulation layer 11, not barrier-metal layer 17, is located under the shifted portion of metal layer 13. When metal layer 13 is etched, resin insulation layer 11 is exposed. Depending on the etching solution, since no resin insulation layer is etched, no problem is caused. Meanwhile, if a slight positional shifting as above is acceptable, the degree of alignment accuracy of the mask is lowered, and the manufacturing cost decreases accordingly.

Figure 3B:
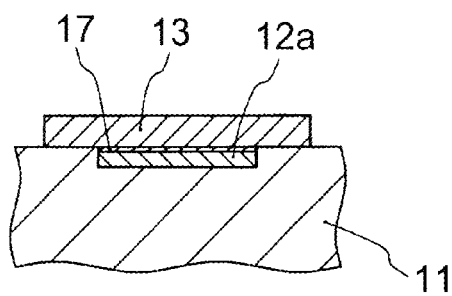

In the example shown in FIG. 3(b), the width of metal layer 13 is greater than any of the widths of barrier-metal layer 17 and first pattern (12a). Metal layer 13 covers barrier-metal layer 17 and first pattern (12a). Namely, portions near the periphery of metal layer 13 jut out from barrier-metal layer 17 and first pattern (12a), extending onto first surface (11a) of resin insulation layer 11. When such a structure is employed and when solder balls with the same size are provided, a solder ball formed on the metal layer spreads out on the entire surface of a larger metal layer 13 as described above, and the resultant solder bump is made shorter. Accordingly, such a metal layer is preferred to be formed where the distance to an electrode pad of an electronic component is smaller when resin insulation layer 11 warps. In this structure as well, no barrier-metal layer 17 is present in the area of etching. However, since resin insulation layer 11 is not etched, no problem results.

The size and positional relationships of metal layer 13, barrier-metal layer 17 and first pattern (12a) are properly selected to achieve various effects described above. The size and positional relationships of metal layer 13, barrier-metal layer 17 and first pattern (12a) can be adjusted by simply modifying the mask for patterning metal layer 13 as described above.

According to the embodiment, since metal layer 13 is formed on barrier-metal 17 positioned on first pattern (12a) of first conductive layer 12, even if resin insulation layer 11 warps during the procedure for mounting an electronic component, connection failure is prevented by modifying the pattern of metal layer 13 when the direction of warping is anticipated in advance. In addition, since metal layer 13 is not embedded in resin insulation layer 11 but protrudes from its surface, metal layer 13 is likely to respond to expansion/contraction of the resin insulation layer, functioning as a layer that absorbs and mitigates stress. Accordingly, a decrease in production yield due to connection failure during the mounting procedure is prevented, and reliability is significantly enhanced because cracking or the like is prevented during heat cycles after the wiring board is installed in a device.

Figure 7:
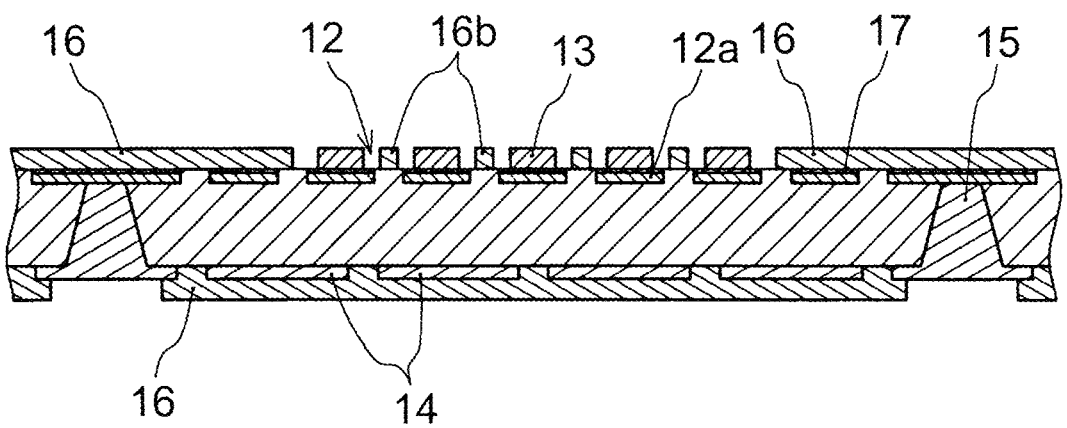
FIG. 7 is a cross-sectional view showing a printed wiring board according to another embodiment of the present invention.

In the examples above, solder-resist layer 16 is formed on portions of resin insulation layer 11 that exclude the region for first patterns (12a) of first conductive layer 12. Namely, in opening (16a) of solder-resist layer 16, no portion of solder-resist layer 16 is present However, since the original purpose of solder-resist layer 16 is to prevent short circuiting between adjacent electrode pads, it is preferred to form solder-resist layer (16b) between first patterns (12a) in opening 16. FIG. 7 shows an example different from that shown in FIG. 1; that is, solder-resist layer (16b) is formed between first patterns (12a). Other than solder-resist layer (16b), the rest is the same as what is shown in FIG. 1. Thus, the same reference numeral is assigned to the corresponding structure, and its description is omitted.

Next, a method for manufacturing a printed wiring board according to an embodiment of the present invention is described with reference to FIGS. 5 and 6A-6H. In the description of the manufacturing method of the present embodiment, the same reference numeral is assigned to a corresponding portion already illustrated in the embodiments describing printed wiring board 1 above, and its description is omitted when applicable.

Figure 5:
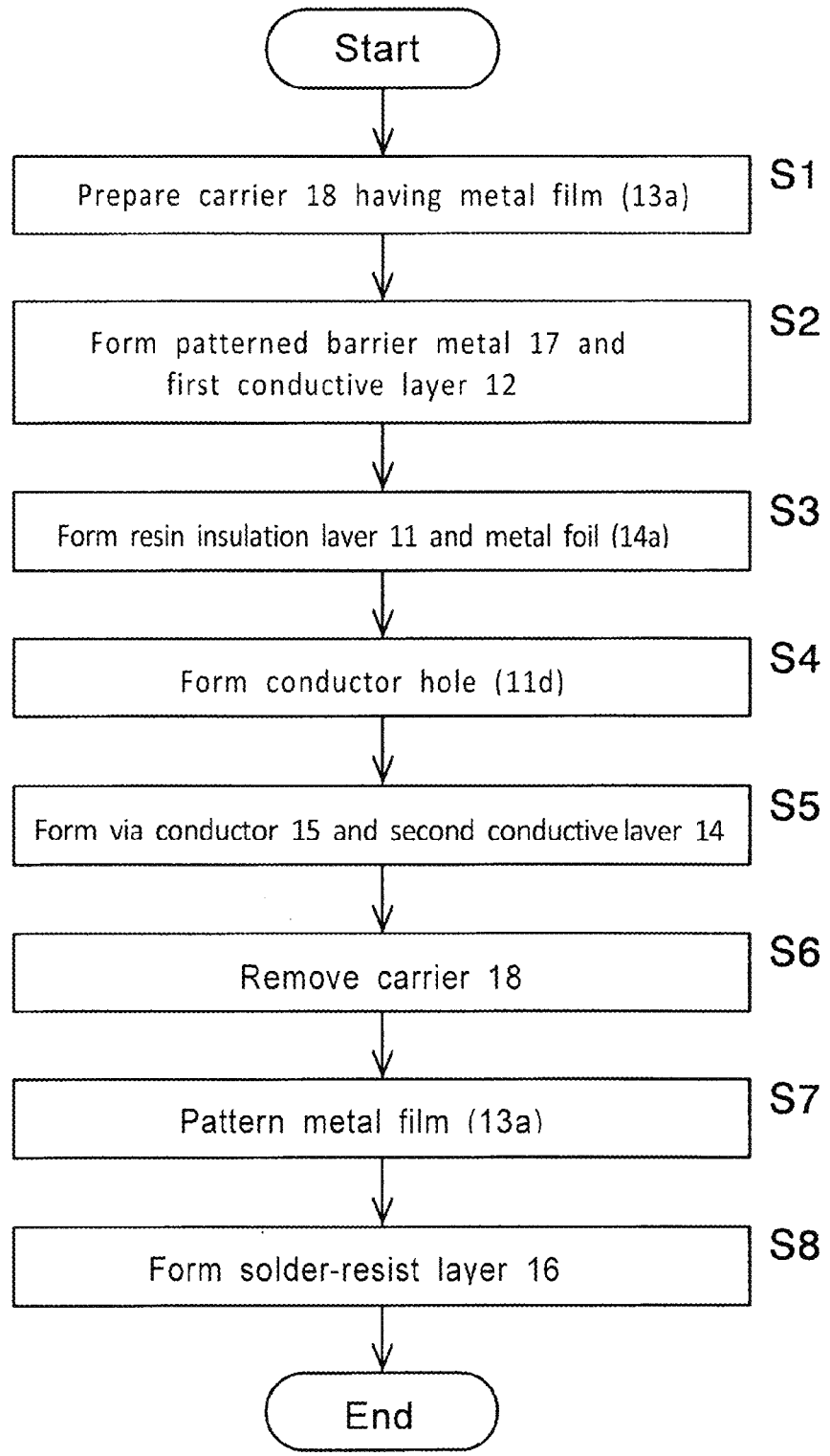
FIG. 5 is a flowchart of a method for manufacturing a printed wiring board according to an embodiment of the present invention.
Figure 6A:
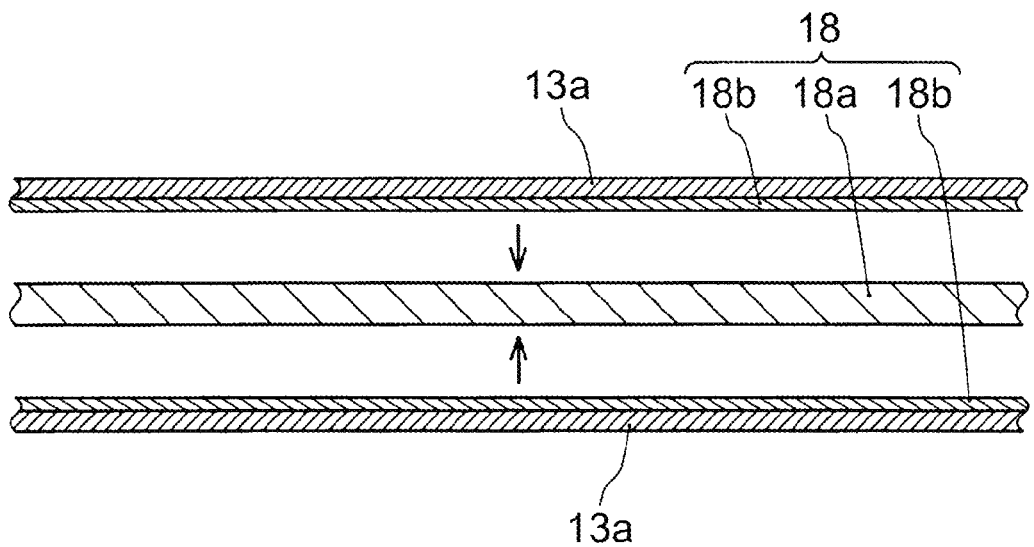
FIG. 6A is a cross-sectional view illustrating a step in a method for manufacturing the printed wiring board shown in FIG. 1.

First, carrier 18 with metal film (13a) is prepared as shown in FIG. 6A and in step (S1) of FIG. 5. A copper-clad laminate is used for carrier 18, but that is not the only option.

In the example shown in FIG. 1, carrier 18 is formed by laminating carrier copper foil (18b) on both surfaces of support plate (18a); namely, metal layer (13a) with carrier copper foil (18b), for example, is laminated by using an adhesive agent through hot pressing or the like on both surfaces of support plate (18a) made of prepreg, for example. The thickness of metal layer (13a) is 5~20 μm, preferably 10~20 μm, and the thickness of carrier copper foil (18b) is 15~30 μm, preferably approximately 18 μm.

Carrier 18 is used as a substrate during production steps and is removed subsequently not to remain on a printed wiring board. Thus, metal film (13a) is provided on its surface so that it is easier for carrier 18 to be separated later from first conductive layer 12 or the like. Metal film (13a) is entirely adhered or fixed to carrier 18 using an easy-to-release adhesive agent such as a thermoplastic resin or the like positioned between metal film (13a) and carrier 18 so as to be easily separated from carrier 18. Namely, carrier copper foil (18b) and metal film (13a) are adhered entirely to each other using thermoplastic resin or the like so as to form metal film (13a) having carrier copper foil (18b), which is then bonded to support plate (18a) by hot pressing or the like. Because of the thermoplastic resin, even when metal film (13a) and carrier copper foil (18b) are entirely adhered, they are easily separated from each other when the temperature is raised. However, that is not the only option, and metal film (13a) and carrier copper foil (18b) may be bonded or fixed to each other only on their peripheries. Because they are fixed or bonded only on the peripheries, they are easily separated from each other when the bonded portions are cut off. In such a case, any adhesive agents other than a thermoplastic type may be used. Since carrier 18 and metal film (13a) are preferred not to have different thermal expansion coefficients, they are preferred to be made of the same type of material. For example, if metal film (13a) is made of nickel, carrier foil is preferred to be made of carrier nickel foil. Thus, a release layer may be provided on the surface of carrier 18 where metal film (13a) is formed.

In the example shown in FIG. 1, carrier copper foil (18b) and metal film (13a) are adhered to each other in advance by using an adhesive agent or the like to form metal film (13a) having carrier copper foil, which is then laminated on support plate (18a). It is an option to form carrier 18 by laminating carrier copper foil (18b) or the like on support plate (18a), and to adhere metal film (13a) to such a carrier on its entire surface or its periphery. Also, the example shows where metal film (13a) is formed on both surfaces of carrier 18. Since a carrier is discarded subsequently, it is preferred to use both surfaces of carrier 18 and produce two printed wiring boards simultaneously. However, it is an option to use only one surface, or to form different circuit patterns respectively on both surfaces. In the example below, the same circuit patterns are formed on both surfaces. Thus, reference numerals and descriptions are provided only for one side. Though both surfaces are shown on the drawings, reference numerals and descriptions are omitted from the other side.

Figure 6B:
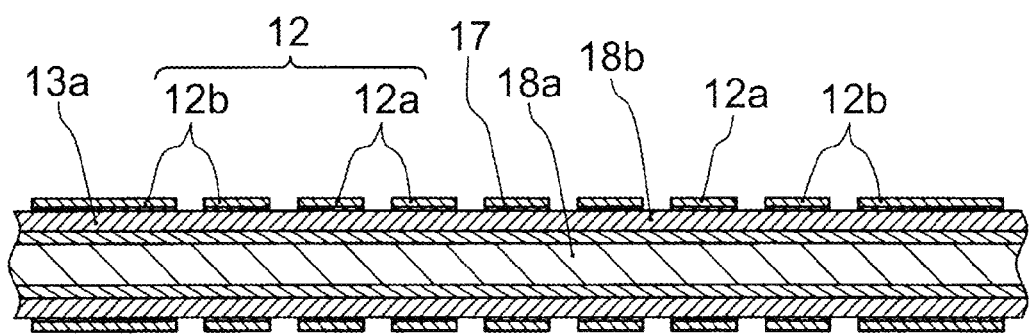
FIG. 6B is a cross-sectional view illustrating a step in the method for manufacturing the printed wiring board shown in FIG. 1.

Next, as shown in FIG. 6B and step (S2) of FIG. 5, first conductive layer 12 includes first patterns (12a) for connection with an electronic component and the rest are second patterns (12b). First conductive layer 12 is formed as follows: a resist pattern (not shown) is formed to obtain a predetermined pattern on a surface of metal film (13a); electroplating is performed using metal film (13a) as one electrode so that nickel plating, for example, is deposited where metal film (13a) is exposed; barrier metal layer 17 is formed; copper plating, for example, is further performed to obtain first conductive layer 12; and the resist pattern is removed. Accordingly, barrier-metal layer 17 and first conductive layer 12 are formed as shown in FIG. 6B.

Figure 6C:
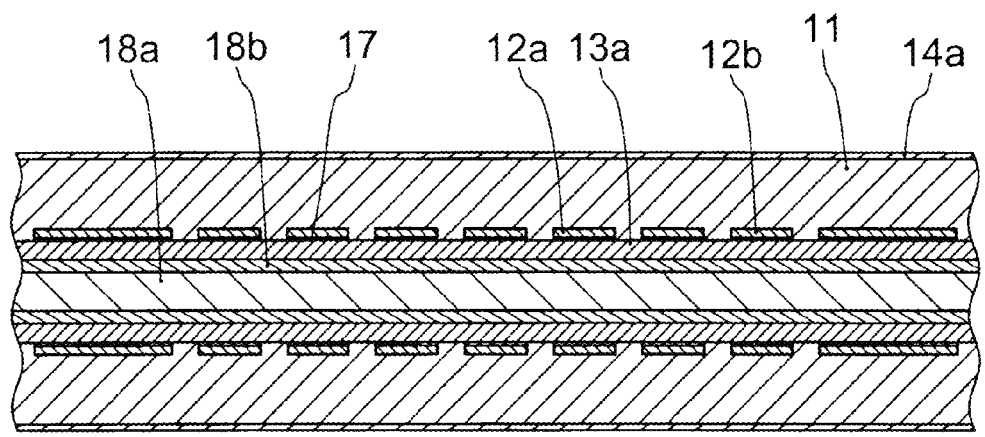
FIG. 6C is a cross-sectional view illustrating a step in the method for manufacturing the printed wiring board shown in FIG. 1.

Next, as shown in FIG. 6C and step (S3) of FIG. 5, resin insulation layer 11 and metal foil (14a), which makes part of second conductive layer 14, are laminated on first conductive layer 12 and on exposed portions of metal film (13a). Resin insulation layer 11 and metal foil (14a) may be laminated by a method such as hot pressing.

Next, as shown in step (S4) of FIG. 5, holes (11d) for conductor are formed by irradiating laser beams. Namely, a $CO_2$ laser or the like is irradiated from the metal foil (14a) side on portions to make connections between first conductive layer 12 and second conductive layer 14, which are respectively formed on both surfaces of resin insulation layer 11.

Figure 6D:
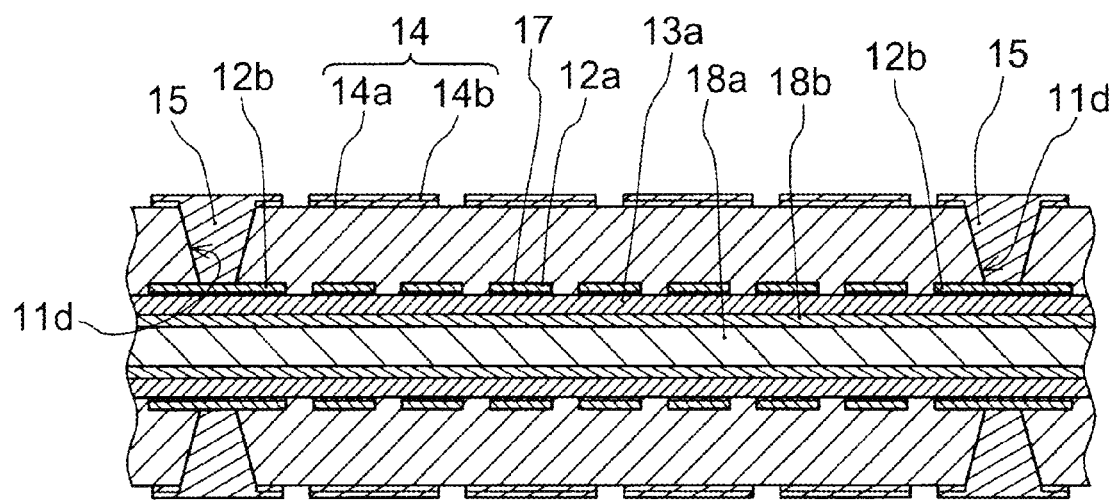
FIG. 6D is a cross-sectional view illustrating a step in the method for manufacturing the printed wiring board shown in FIG. 1.

Next, metal film such as electroless plated film (not shown) is formed in holes (11d) for conductor and on metal foil (14a). Then, as shown in FIG. 6D and step (S5) of FIG. 5, electroplating, for example, is performed to form via conductors 15 while forming a layer made up of metal film (not shown) and electroplated film on the surface of metal foil (14a). Second conductive layer 14 is formed by metal foil (14a), metal film (not shown) and electroplated film (14b). Then, when the metal film (not shown), metal foil (14a) and electroplated film (14b) are patterned, triple-layered second conductive layer 14 is formed as shown in FIG. 6D. Second conductive layer 14 is patterned by a generally employed method, that is, by forming a resist film, patterning and etching.

Figure 6E:
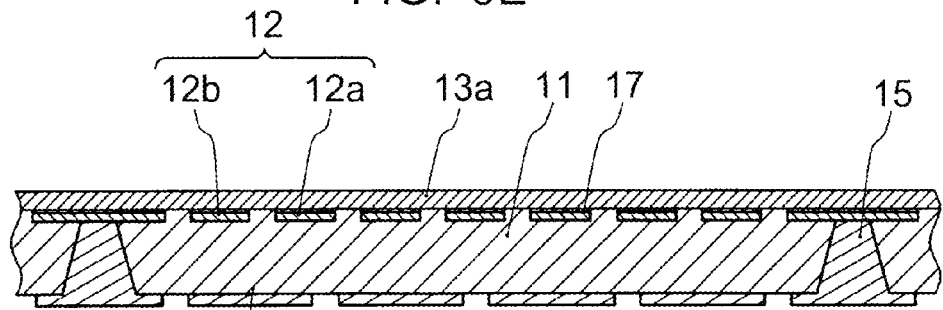
FIG. 6E is a cross-sectional view illustrating a step in the method for manufacturing the printed wiring board shown in FIG. 1.

Next, as shown in FIG. 6E and step (S6) of FIG. 5, carrier 18 is removed. To simplify descriptions, only the upper side of carrier 18 shown in FIG. 6D is vertically inverted and shown in FIG. 6E. As described above, carrier 18 (carrier copper foil (18b)) and metal film (13a) are fixed by using an easy-to-release adhesive agent or the like, such as a thermoplastic resin. They are easily peeled off from each other when the temperature is raised, thus exposing the surface of metal film (13a) where carrier copper foil (18b) was adhered.

Figure 6F:
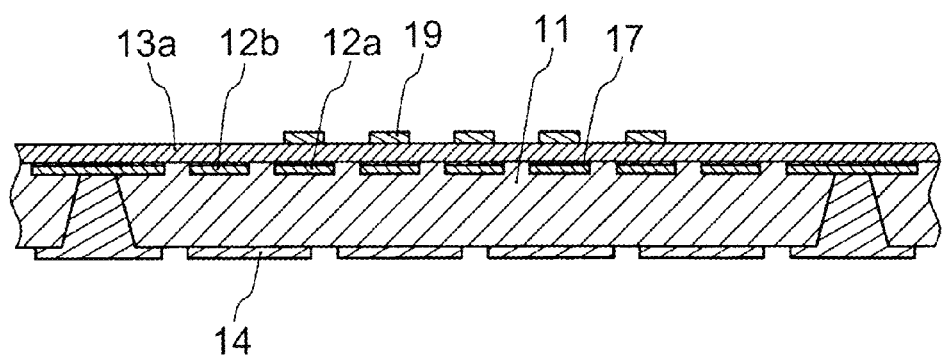
FIG. 6F is a cross-sectional view illustrating a step in the method for manufacturing the printed wiring board shown in FIG. 1.
Figure 6G:
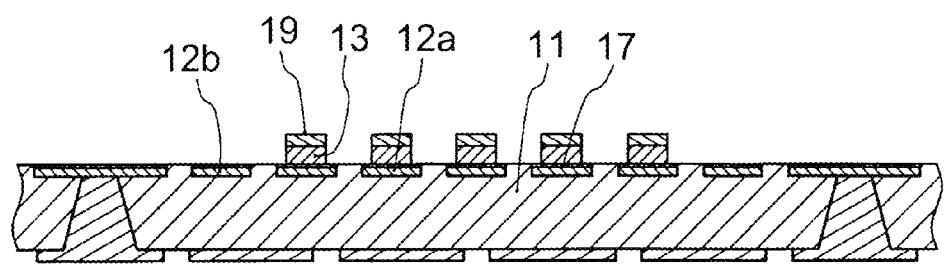
FIG. 6G is a cross-sectional view illustrating a step in the method for manufacturing the printed wiring board shown in FIG. 1.
Figure 6H:
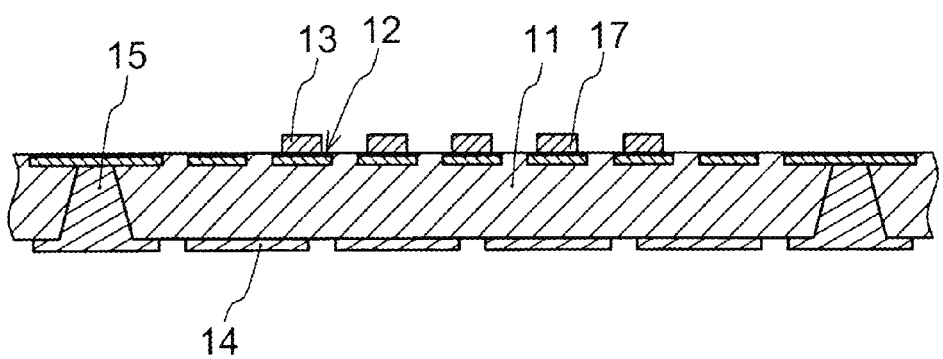
FIG. 6H is a cross-sectional view illustrating a step in the method for manufacturing the printed wiring board shown in FIG. 1.

Next, as shown in FIG. 6F~6H and step (S7) of FIG. 5, metal film (13a) is patterned to obtain metal layer 13 (see FIG. 6H). Metal layer 13 is patterned when mask 19 made of solder-plated film is formed and patterned to be positioned on surfaces of first patterns (12a) of first conductive layer 12 as shown in FIG. 6F, and then portions exposed from mask 19 made of solder-plated film are etched. Accordingly, metal layer 13 is formed with a predetermined pattern (FIG. 6G). At that time, the width of metal layer 13 is slightly smaller than the width of mask 19 made of solder plated film, but first conductive layer 12 is not etched more than desired, since etching on the first-conductive layer 12 side stops at barrier-metal layer 17. After that, mask 19 made of solder-plated film is kept thereon so that it is used as bonding material. However, it is an option to form a mask by using generally used resist film instead of solder-plated film. In such a case, mask 19 may be removed after metal layer 13 is removed. In the example shown in FIG. 6H, mask 19 is removed.

As described above, metal layer 13 may be formed in various shapes as shown in FIG. 2-3 by modifying the shape of mask 19. Namely, the structure shown in FIG. 2 is obtained when the size of mask 19 is made smaller than that of first pattern (12a); the structure shown in FIG. 3(a) is obtained when the size of mask 19 is the same as that of first pattern (12a) but their positions are shifted from each other; and the structure shown in FIG. 3(b) is obtained when the size of mask 19 is greater than that of first pattern (12a). Since those patterns are significantly small, the mask inevitably shifts slightly. Thus, structures in FIG. 2-3 may result unintentionally However, if any of the structures shown in FIG. 2-3 is not desired, it is possible to avoid those structures.

Next, to protect the surface of resin insulation layer 11 during the procedure for mounting an electronic component, solder-resist layer 16 is formed on the region of second patterns (12b) that excludes first patterns (12a) for mounting an electronic component, on first surface (11a) of resin insulation layer 11, and on second surface (11b) of resin insulation layer 11 (step S8). Accordingly, the structure shown in FIG. 1 is obtained. Solder-resist layer 16 is formed, for example, by coating solder resist on the entire surface and by patterning through the use of photolithographic techniques.

Then, surface treatment (not shown) is conducted by coating OSP, Ni/Au, Ni/Pd/Au, Sn or the like on exposed surfaces of metal layer 13 and second conductive layer 12.

According to the present embodiment, printed wiring board 1 is manufactured to have metal layer 13 formed to protrude from a surface (first surface) of resin insulation layer 11 as described above. First patterns (12a) of first conductive layer 12 are electrically connected to an electronic component (not shown) through metal layer 13. Metal layer 13 is capable of mitigating stress exerted on printed wiring board 1 even when warping occurs repeatedly in printed wiring board 1. As a result, the connected portions between the electronic component and first patterns (12a) of first conductive layer 12 are less likely to break, and connection failure seldom occurs.

As described in the above manufacturing method, metal layer 13 is formed by simply patterning metal film (13a) formed on a surface of a copper-clad carrier. For forming a printed wiring board that is not provided with the aforementioned metal layer 13, metal film (13a) is necessary as a base layer when a first conductive layer 12 is formed, but metal film (13a) is totally discarded after a certain process. In the present embodiment, however, a metal film removed by etching or the like can be utilized for mitigating thermal stress caused by heat cycles or the like by employing a slightly thicker metal film (13a) and by retaining portions of the metal film. In other words, although a patterning step for the metal layer is added, significant effects are achieved without adding extra material.

In addition, according to the above manufacturing method, since metal layer 13 is formed by patterning metal film (13a), the size of metal layer 13 is adjustable by modifying the mask pattern. Thus, when warping occurs in resin insulation layer 11 during the procedure for mounting an electronic component and causes different distances between multiple electrode pads of the electronic component and first patterns (12a) of first conductive layer 12, since the direction of warping is anticipated in advance, metal layer 13 is patterned to have a smaller diameter on first patterns (12a) where the distance is greater, whereas metal layer 13 is patterned to have a greater diameter on first patterns (12a) where the distance is smaller. By so setting, even when resin insulation layer 11 warps due to the temperature rise during a solder reflow process for mounting an electronic component, all electrode pads are securely connected to first patterns (12a). Moreover, since barrier-metal layer 17 is formed under the metal layer, first conductive layer 12 is not etched regardless of the shape of metal layer 13, and no damage results in first conductive layer 12.

The example shown in FIG. 1 is a printed wiring board having a double-layer structure where a pair of conductive layers (first conductive layer 12 and second conductive layer 14) are formed to sandwich a single-layered resin insulation layer. However, that is not the only option; for example, after second conductive layer 14 shown in FIG. 6D, a second resin insulation layer and a second metal foil are further laminated on second conductive layer 14 and on the exposed surface of resin insulation layer 11 as shown in FIG. 6C, and the procedure shown in FIG. 6E and subsequent drawings are conducted so that a triple-layered structure is obtained.

To protect surfaces of a printed wiring board, a solder-resist layer may be coated on regions excluding where an electronic component is to be mounted. However, when circuit patterns are embedded on one side of an insulative substrate while circuit patterns are formed on the other side without having an embedded structure, the thickness of a solder-resist layer on one side is thinner than that on the other side by an amount corresponding to the thickness of the circuit patterns. When solder-resist layers are formed respectively on the upper and lower surfaces of an insulative substrate to have different volumes from each other, the insulative substrate warps when temperatures rise and fall. Warping of the insulative substrate causes variations in the distance between electrode pads of an electronic component and pads of the circuit patterns embedded in the insulative substrate during the procedure for mounting the electronic component through solder bumps. Accordingly, connection failure may result, or bonded portions between the electronic component and the circuit patterns may be peeled by a repeated rise and fall in temperature during heat cycles that occur after the wiring board is installed in a device and turned on and off Subsequently, the connection reliability of a printed wiring board is reduced.

A printed wiring board according to an embodiment of the present invention achieves secure connection during the procedure for mounting an electronic component on a region of the printed wiring board through solder bumps or the like, and exhibits enhanced connection reliability by suppressing cracking or the like from occurring at connection portions caused by a repeated rise and fall in temperature during heat cycles after the wiring board is installed in an electronic device and used therein. Another embodiment of the present invention is a method for manufacturing such a printed wiring board.

A printed wiring board according to one aspect of the present invention is provided with the following: a resin insulation layer having a first surface and a second surface opposite the first surface; a first conductive layer embedded on the first-surface side of the resin insulation layer and electrically connected to an electronic component; a second conductive layer formed on the second surface of the resin insulation layer; a via conductor penetrating through the resin insulation layer and electrically connecting the first conductive layer and the second conductive layer; and a solder-resist layer formed on the first surface of the resin insulation layer and on the first conductive layer and having an opening to expose a region of the first conductive layer which is for connection with the electronic component. Then, a barrier-metal layer and a metal layer are formed in that order on the first conductive layer exposed from the opening. The barrier-metal layer is made of a metal different from that of the metal layer, and the metal layer protrudes from the first surface of the resin insulation layer.

A method for manufacturing a printed wiring board according to another aspect of the present invention includes the following: preparing a carrier with a metal film formed thereon; forming a barrier-metal layer on the metal film; on the barrier-metal layer, forming a first conductive layer for connection with an electronic component; forming a resin insulation layer on the metal film in a way to embed the first conductive layer; from the exposed-surface side of the resin insulation layer, forming a hole for conductor penetrating through the resin insulation layer and exposing the first conductive layer; forming a second conductive layer on the exposed-surface side of the resin insulation layer while filling the hole for conductor with a conductive material; removing the carrier to expose a surface of the metal film; using the barrier-metal layer as an etching stopper, forming a pattern on the metal layer by performing selective etching so as to remove the metal film except for the region of the first conductive layer to be connected to an electronic component; and forming a solder-resist layer on the first surface of the resin insulation layer and on the first conductive layer where the metal layer is not formed.

In a printed wiring board according to an embodiment of the present invention, a first conductive layer is embedded in a resin insulation layer in a way to expose a surface. Then, a metal layer is formed on each pattern of the first conductive layer for connection with an electronic component, and the metal layer is formed to protrude from the surface of the resin insulation layer. Moreover, a barrier-metal layer is provided between the metal layer and the first conductive layer. When a metal layer is made thicker, it is difficult to control the etching depth while patterning the metal layer. However, since etching in a thickness direction can be stopped by the barrier-metal layer, there is no risk of over-etching the first conductive layer, and a thick metal layer is thereby formed, allowing stress caused by the difference in thermal expansion coefficients to be more likely absorbed by the thick metal layer. As a result, during a procedure for mounting an electronic component, stress is mitigated and connection reliability is significantly enhanced. In addition, the size of the pattern of the metal layer is adjustable by simply selecting a mask for patterning. When a temperature rise causes the resin insulation layer to warp during a solder reflow process for mounting an electronic component, the size of the metal layer is adjusted so that the height of solder bumps or the like is adjusted, and connection failure due to such warping is prevented accordingly.

Moreover, in a manufacturing method according to another embodiment of the present invention, the metal layer is made using the metal film formed on a carrier. Namely, a metal film is patterned and the remaining portions form a metal layer, rather than discarded. Although it is preferred to use a metal film slightly thicker than ones used conventionally, a metal layer is formed without causing much increase in materials and manufacturing process.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
  a resin insulation layer;
  a first conductive layer formed on a first-surface side of the resin insulation layer such that the first conductive layer is embedded into a first surface of the resin insulation layer;
  a second conductive layer formed on a second-surface side of the resin insulation layer such that the second conductive layer is formed on a second surface of the resin insulation layer;
  a via conductor formed in the resin insulation layer such that the via conductor is penetrating through the resin insulation layer and electrically connecting the first conductive layer and the second conductive layer; and
  a solder-resist layer formed on the first surface of the resin insulation layer such that the solder-resist layer is covering the first conductive layer and having an opening structure forming an exposed structure of the first conductive layer,
  wherein the exposed structure of the first conductive layer is configured to connect an electronic component to the first conductive layer, and the first conductive layer has a barrier-metal layer embedded into the first surface of the resin insulation layer and a metal layer formed on the barrier-metal layer such that the barrier-metal layer is formed on a surface of the first conductive layer and comprises a metal different from a metal forming the metal layer and that the metal layer is formed on a surface of the barrier-metal layer in the exposed structure of the first conductive layer and protruding from the first surface of the resin insulation layer.

2. A printed wiring board according to claim 1, wherein the metal layer is formed on the surface of the barrier-metal layer such that the metal layer has an entire surface facing the barrier-metal layer in contact with the barrier-metal layer.

3. A printed wiring board according to claim 2, wherein the barrier-metal layer has a surface such that a surface portion not in contact with the metal layer is formed flat.

4. A printed wiring board according to claim 1, wherein the metal layer is made of copper, and the barrier-metal layer is made of one of nickel and titanium.

5. A printed wiring board according to claim 4, wherein the metal layer is a copper foil, and the first conductive layer is a copper plated film.

6. A printed wiring board according to claim 1, wherein the metal layer has a thickness which is greater than a thickness of the solder-resist layer.

7. A printed wiring board according to claim 6, wherein the metal layer has the thickness of 10 μm or greater.

8. A printed wiring board according to claim 1, wherein the exposed structure of the first conductive layer comprises a plurality of connection portions, and the opening structure of the solder-resist layer comprises an opening portion exposing the plurality of connection portions.

9. A printed wiring board according to claim 1, wherein the exposed structure of the first conductive layer comprises a plurality of connection portions, and the opening structure of the solder-resist layer comprises a plurality of opening portions exposing the plurality of connection portions, respectively.

10. A printed wiring board according to claim 1, wherein the metal layer comprises copper, and the barrier-metal layer is made of one of nickel and titanium.

11. A printed wiring board according to claim 10, wherein the first conductive layer is a copper plated film.

12. A printed wiring board according to claim 2, wherein the metal layer has a thickness which is greater than a thickness of the solder-resist layer.

13. A printed wiring board according to claim 12, wherein the metal layer has the thickness of 10 μm or greater.

14. A method for manufacturing a printed wiring board, comprising:

forming a barrier-metal layer on a metal film formed on a carrier;

forming a first conductive layer on the barrier-metal layer;

forming a resin insulation layer on the metal film such that the first conductive layer is embedded into the resin insulation layer;

forming a hole for a via conductor from an exposed-surface side of the resin insulation layer such that the hole penetrates through the resin insulation layer and exposes a portion of the first conductive layer;

forming a second conductive layer on the exposed-surface side of the resin insulation layer such that the hole is filled with a conductive material;

removing the carrier from the metal film such that a surface of the metal film is exposed;

applying selective etching to the metal film by using the barrier-metal layer as an etching stopper such that a metal layer having a pattern configured to connect an electronic component is formed by removing a portion of the metal film; and forming a solder-resist layer on the first surface of the resin insulation layer such that the solder-resist layer covers the first conductive layer and has an opening structure forming an exposed structure of the first conductive layer comprising the metal layer having the pattern configured to connect the electronic component.

15. A method for manufacturing a printed wiring board according to claim 14, wherein the metal layer is formed on the surface of the barrier-metal layer such that the metal layer has an entire surface facing the barrier-metal layer in contact with the barrier-metal layer.

16. A method for manufacturing a printed wiring board according to claim 14, wherein the barrier-metal layer has a surface such that a surface portion not in contact with the metal layer is formed flat.

17. A method for manufacturing a printed wiring board according to claim 14, wherein the metal layer is made of copper, and the barrier-metal layer is made of one of nickel and titanium.

18. A method for manufacturing a printed wiring board according to claim 14, wherein the metal layer is a copper foil, and the first conductive layer is a copper plated film.

19. A method for manufacturing a printed wiring board according to claim 14, wherein the metal layer has a thickness which is greater than a thickness of the solder-resist layer.

20. A method for manufacturing a printed wiring board according to claim 19, wherein the metal layer has the thickness of 10 μm or greater.

* * * * *